(12) United States Patent
Mauer et al.

(10) Patent No.: US 9,966,933 B1
(45) Date of Patent: *May 8, 2018

(54) PIPELINED SYSTOLIC FINITE IMPULSE RESPONSE FILTER

(71) Applicant: Altera Corporation, San Jose, CA (US)

(72) Inventors: Volker Mauer, Princes Risborough (GB); Martin Langhammer, Salisbury (GB)

(73) Assignee: ALTERA CORPORATION, San Jose, CA (US)

( * ) Notice: Subject to any disclaimer, the term of this patent is extended or adjusted under 35 U.S.C. 154(b) by 34 days.

This patent is subject to a terminal disclaimer.

(21) Appl. No.: 15/161,210

(22) Filed: May 21, 2016

Related U.S. Application Data

(63) Continuation of application No. 14/193,477, filed on Feb. 28, 2014, now Pat. No. 9,379,687.

(60) Provisional application No. 61/927,112, filed on Jan. 14, 2014.

(51) Int. Cl.
*G06F 17/10* (2006.01)
*H03H 17/02* (2006.01)

(52) U.S. Cl.
CPC .............................. *H03H 17/0248* (2013.01)

(58) Field of Classification Search
None
See application file for complete search history.

(56) References Cited

U.S. PATENT DOCUMENTS

| | | | | |
|---|---|---|---|---|
| 5,339,264 A * | 8/1994 | Said | ........................ | H03H 17/06 708/313 |
| 5,388,062 A * | 2/1995 | Knutson | ............ | H03H 17/0294 708/300 |
| 5,777,912 A * | 7/1998 | Leung | .................... | H03H 17/06 708/319 |
| 5,987,487 A * | 11/1999 | Welland | .................. | H03M 7/18 708/300 |
| 7,120,656 B1 * | 10/2006 | Lam | .................... | H03H 17/0009 708/319 |
| 7,127,481 B1 * | 10/2006 | Lam | .................... | H03H 17/0229 708/319 |
| 7,774,395 B2 * | 8/2010 | Wagner | ............. | H03H 17/0225 708/319 |
| 8,386,550 B1 * | 2/2013 | Mauer | .................... | H03H 17/06 708/301 |
| 9,379,687 B1 * | 6/2016 | Mauer | .................... | H03H 17/06 |

* cited by examiner

*Primary Examiner* — David H Malzahn
(74) *Attorney, Agent, or Firm* — Fletcher Yoder P.C.

(57) ABSTRACT

A systolic FIR filter circuit includes a plurality of multipliers, a plurality of sample pre-adders, each respective one of the sample pre-adders connected to a sample input of a respective multiplier, and an output cascade adder chain including a respective output adder connected to a respective multiplier. The output cascade adder chain includes a selectable number of delays between adjacent output adders. An input sample chain has a first leg and a second leg. Each respective one of the sample pre-adders receives a respective input from the first leg and a respective input from the second leg. The input sample chain has, between adjacent sample points in at least one of the legs, a selectable number of sample delays related to the selectable number of output delays. Connections of inputs from the input sample chain to the sample pre-adders are adjusted to account for the selectable number.

20 Claims, 14 Drawing Sheets

PIPELINED SYSTOLIC FINITE IMPULSE RESPONSE FILTER

CROSS REFERENCE TO RELATED APPLICATION

This is a continuation of commonly-assigned U.S. patent application Ser. No. 14/193,477, filed Feb. 28, 2014, now U.S. Pat. No. 9,379,687, which is hereby incorporated by reference herein in its entirety, and which claims the benefit of commonly-assigned U.S. Provisional Patent Application No. 61/927,112, filed Jan. 14, 2014, which is hereby incorporated by reference herein in its entirety.

FIELD OF THE INVENTION

This invention relates to implementation of a pipelined systolic finite impulse response (FIR) filter, and particularly to implementation of such a filter as variable-latency filter in an integrated circuit device, especially a programmable integrated circuit device.

BACKGROUND OF THE INVENTION

Symmetrical FIR filters have a sample chain with forward and reverse branches. For each filter tap, samples from both branches are combined (e.g., added together). Proper operation of the filter depends on known delay relationships between the samples in the branches of the sample chain. If the circuit is pipelined in order to increase the operating frequency of the device on which the circuit is implemented, the introduction of pipeline registers in the sample chain can affect those delay relationships.

The potential impact of pipelining may be felt in a fixed device such as an application-specific integrated circuit (ASIC) device, but may be felt even more acutely in a programmable integrated circuit device such as a programmable logic device (PLD), of which field-programmable gate arrays (FPGAs) are one type, because there frequently is a greater need in such devices for deeper pipelining to meet the operating frequency ($F_{max}$) requirements of such devices.

SUMMARY OF THE INVENTION

In accordance with embodiments of the present invention, the sample path of a systolic FIR filter is adjusted along with the delays introduced by pipelining to maintain the correct sample relationships even in a pipelined implementation of a systolic FIR filter.

In accordance with some embodiments, the connection pattern of the sample path is altered to account for delays introduced by pipelining. Such embodiments are particularly suited to a filter circuit implemented in an ASIC or other fixed device.

In accordance with other embodiments, both branches of the sample path run in the same direction, with the sample signal injection point located accordingly, and delays are implemented using addressable memories, such as FIFO memories, where addressing is used to maintain correct sample relationships, accounting for pipelining and other delays.

Therefore, in accordance with embodiments of the present invention there is provided a systolic FIR filter circuit including a plurality of multipliers, each respective one of the multipliers having a respective coefficient input, a respective sample input, and a respective multiplier output, a plurality of sample pre-adders, each respective one of the sample pre-adders connected to a sample input of a respective one of the multipliers, and an output cascade adder chain including a respective output adder connected to each respective one of the multipliers, each respective output adder having a first input receiving the respective multiplier output, and, except for a first output adder in the output cascade adder chain, having a second input receiving an output of a previous one of the output adders. The output cascade adder chain further includes a selectable number of output delays between adjacent ones of the output adders. An input sample chain has a first leg and a second leg. Each respective one of the sample pre-adders receives a respective input from a respective sample point in the first leg and a respective input from a respective sample point the second leg. The second leg has, between adjacent sample points, a selectable number of sample delays related to the selectable number of output delays. Connections of inputs from the input sample chain to the sample pre-adders are adjusted to account for the selectable number.

There is also provided a systolic FIR filter circuit including an input sample chain having a first leg and a second leg. The filter has a plurality of taps, each of the taps combining a sample from a respective sample point in the first leg and a sample from a respective sample point in the second leg. The input sample chain has an input at a point common to both legs. For each of the taps, the respective sample point in the first leg and the respective sample point in the second leg are separated from the common point by an identical number of sample points.

A programmable integrated circuit device configured as such a filter, and a method of configuring a programmable integrated circuit device as such a filter, are also provided.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

Figure 1:
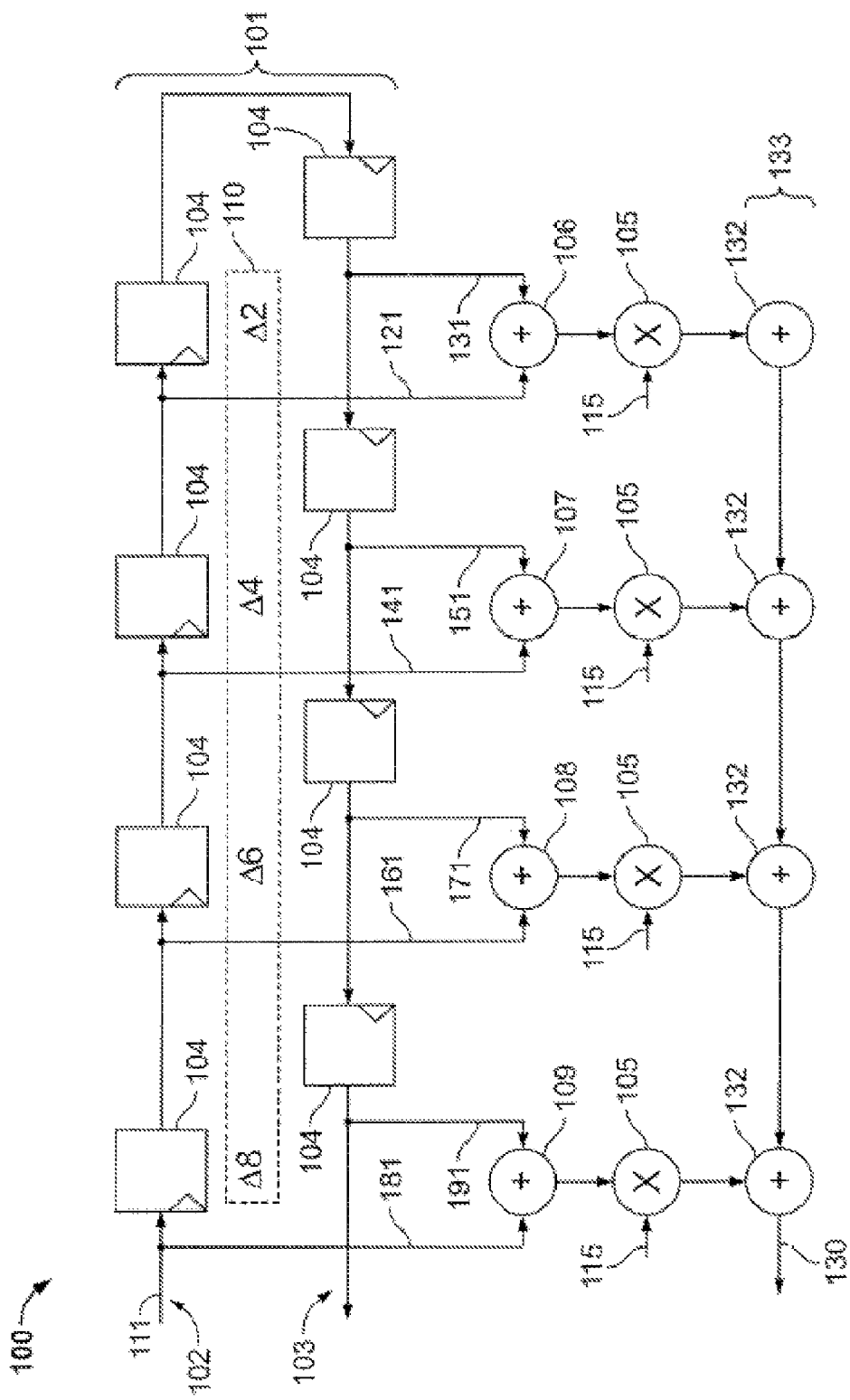
FIG. 1 shows an example of a known four-tap even-symmetric FIR filter.

FIG. 1 shows an example of a basic, known, four-tap even-symmetric FIR filter 100. Samples are input at 111 to sample chain 101, which includes a forward leg or "forward sample chain" 102 and a reverse leg or "reverse sample chain" 103. Each register 104 in sample chain 101 provides a single clock delay. Each tap of filter 100 is the output of one of multipliers 105, which has as inputs a respective stored coefficient 115 (coefficient storage is not shown), and a respective pre-adder which adds together two samples—one from forward sample chain 102 and one from reverse sample chain 103. Cascaded adders 132 from an output adder cascade chain 133 that provides filter output 130. Of course, while four taps are shown in this drawing, the number of taps is arbitrary.

In this example 100, pre-adder 106 adds two samples 121, 131, which are separated by two delays. Pre-adder 107 adds two samples 141, 151, which are separated by four delays. Pre-adder 108 adds two samples 161, 171, which are separated by six delays. Pre-adder 109 adds two samples 181, 191, which are separated by eight delays. These differences 110 in delay (labeled $\Delta 2, \Delta 4, \Delta 6, \Delta 8$ in the four-tap example of this drawing, it being understood that the series would continue for delay differences for a greater number of taps) between successive symmetric taps should be consistently applied to provide proper filter function.

Figure 2:
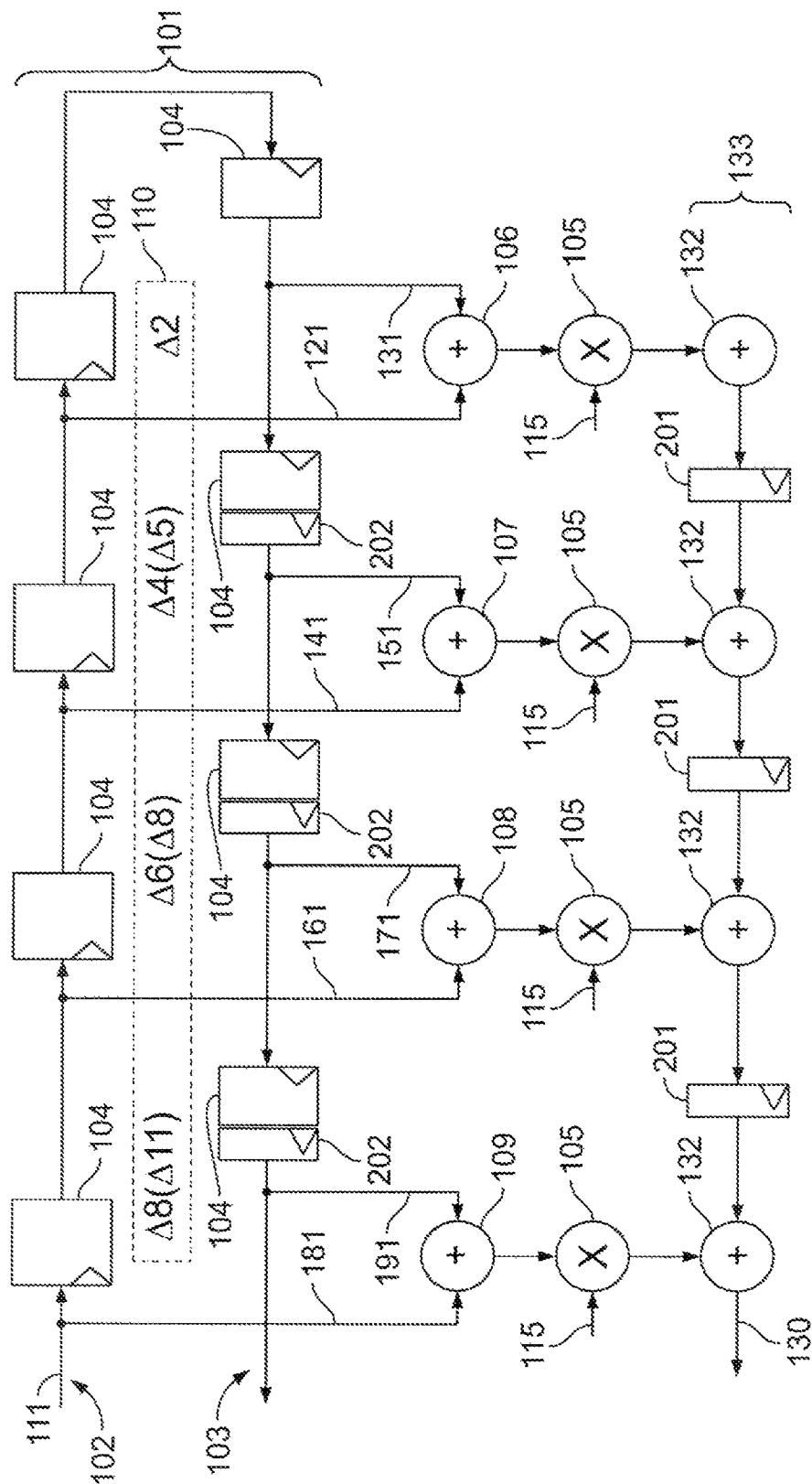
FIG. 2 shows the result of attempting to add one systolic delay between each pair of adjacent adders in the output cascade chain of the filter of FIG. 1.

FIG. 2 shows the result of attempting to add one systolic delay 201 between each pair of adjacent adders 132 in output cascade chain 133. To maintain timing, corresponding delays 202 are added to input sample chain 101. However, the result is that instead of differences of $\Delta 2, \Delta 4, \Delta 6, \Delta 8$ in delay between the between successive symmetric taps, the differences in delay are $\Delta 2, \Delta 5, \Delta 8, \Delta 11$. But the $\Delta 2, \Delta 4, \Delta 6, \Delta 8$ pattern is required for proper filter function. Thus, while timing is maintained, the filter function is not.

Figure 3:
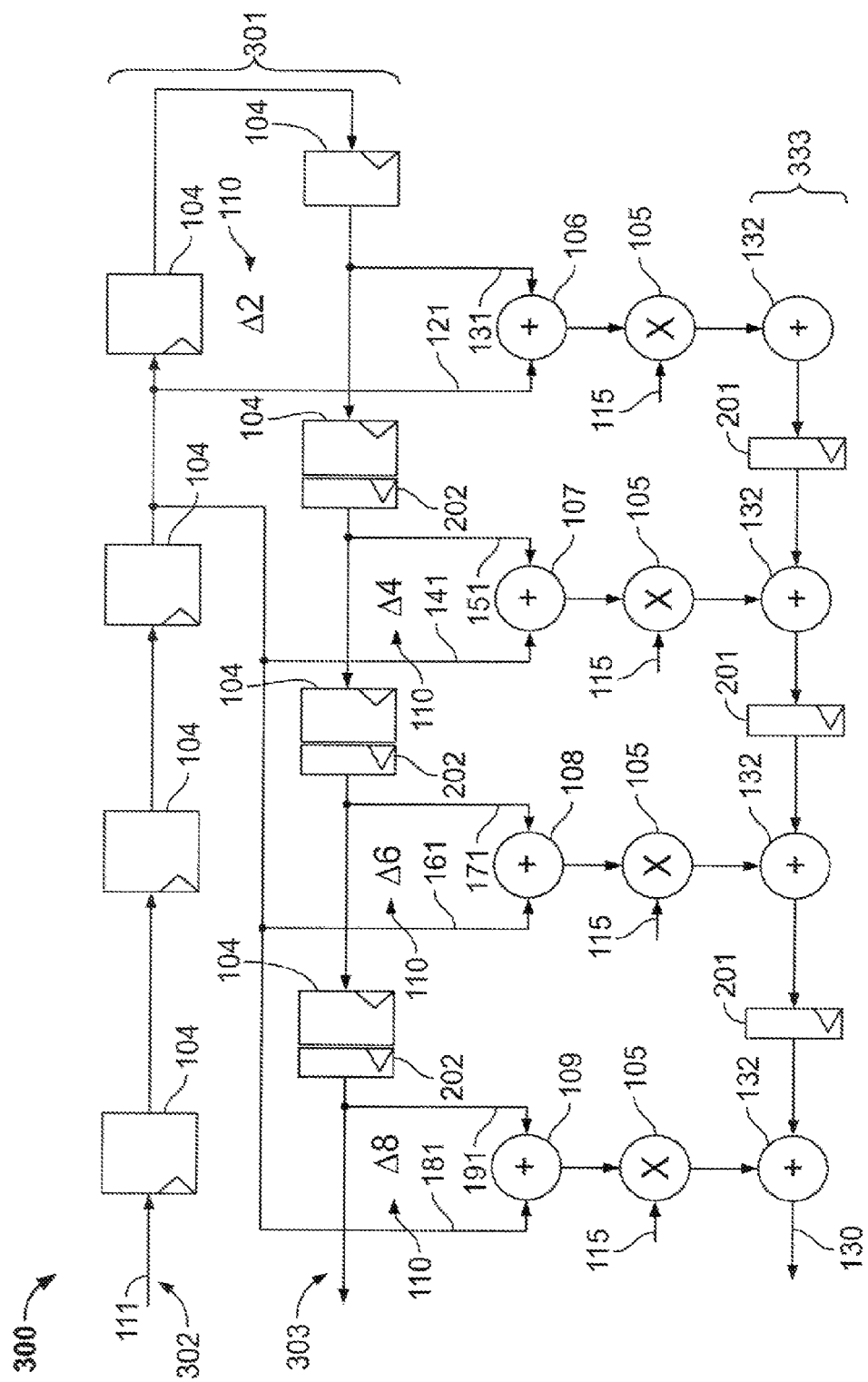
FIG. 3 shows one solution according to one embodiment of the present invention for the problem illustrated in FIG. 2.

FIG. 3 shows a solution according to one embodiment of the present invention for the problem illustrated in FIG. 2. In filter 300, the input sample chain 301 is rewired so that the samples in forward sample chain 302 reach respective pre-adders 107, 108, 109 later, to account for the added delays 201, 202 in output cascade chain 333 and reverse sample chain 303, thus restoring proper filter function.

Figure 4:
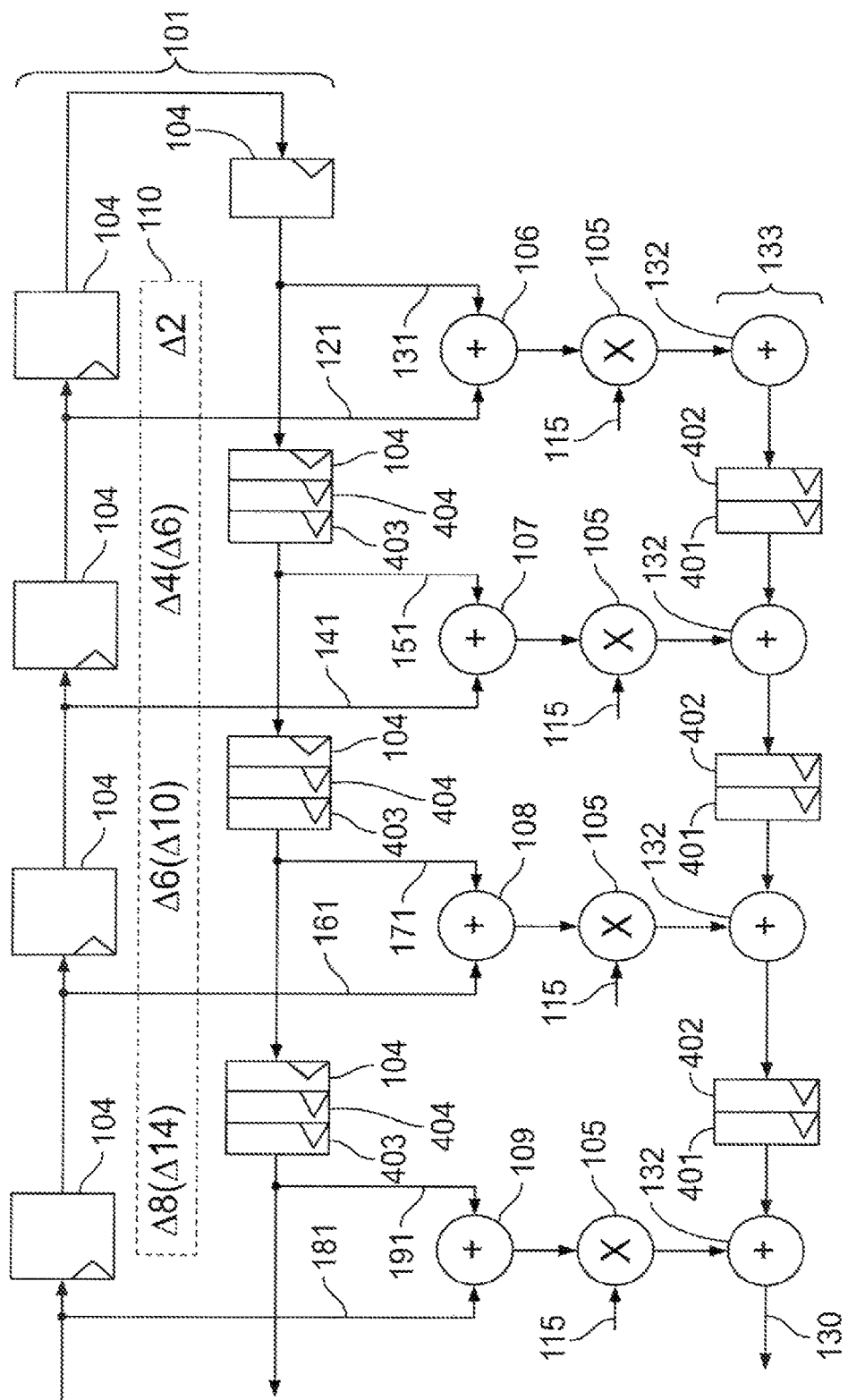
FIG. 4 shows the result of attempting to add two systolic delays between each pair of adjacent adders in the output cascade chain of the filter of FIG. 1.

FIG. 4 shows the result of attempting to add two systolic delays 401, 402 between each pair of adjacent adders in output cascade chain 133. To maintain timing, corresponding delays 403, 404 are added to input sample chain 101. However, the result is that instead of differences of $\Delta 2, \Delta 4, \Delta 6, \Delta 8$ in delay between the pairs of samples at the respective pre-adders, the differences in delay are $\Delta 2, \Delta 6, \Delta 10, \Delta 14$. Once again, while timing is maintained, the filter function is not.

Figure 5:
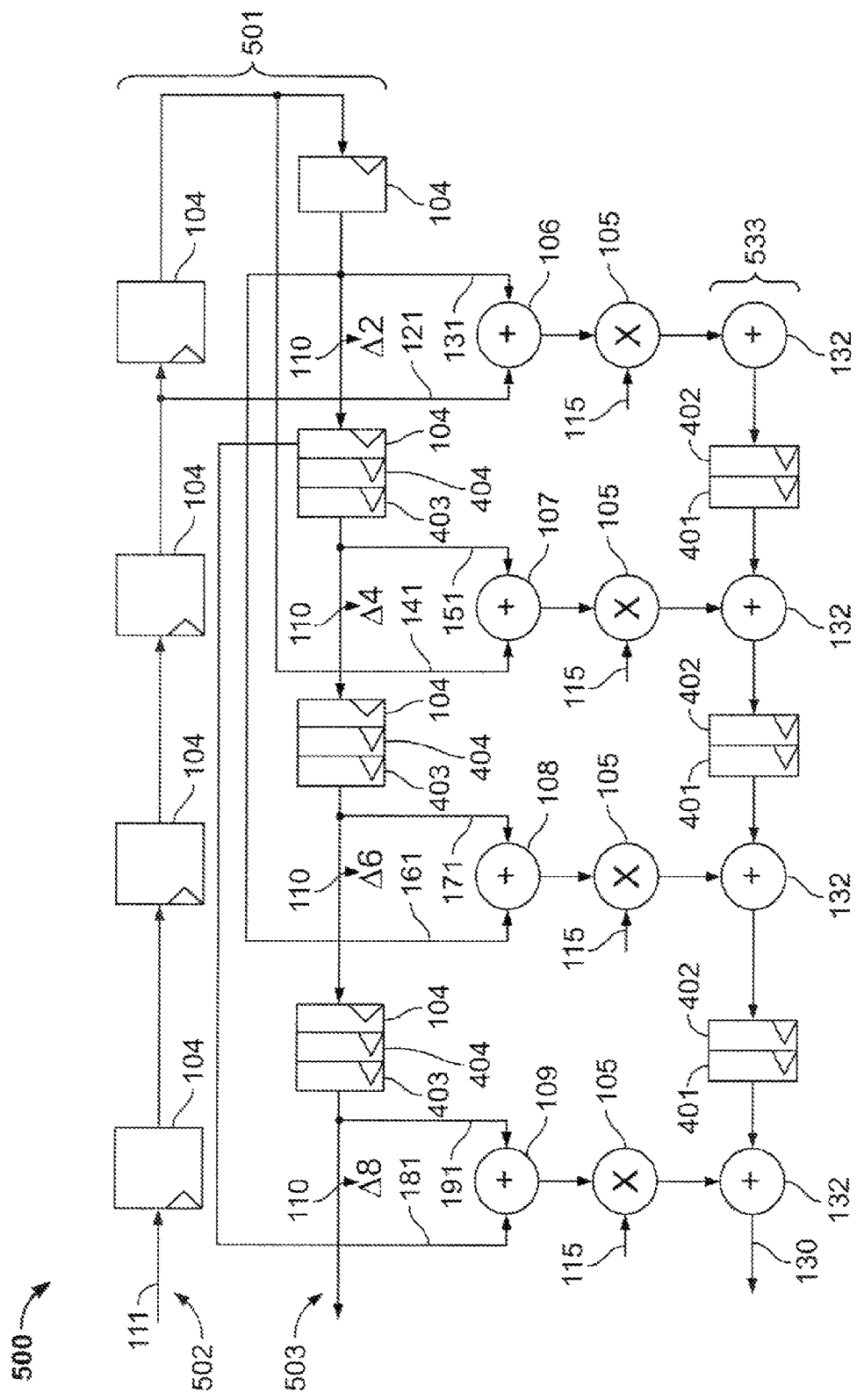
FIG. 5 shows one solution according to a second embodiment of the present invention for the problem illustrated in FIG. 4.

FIG. 5 shows a solution according to another embodiment of the present invention for the problem illustrated in FIG. 4. In filter 500, the input sample chain 501 is rewired so that the samples in forward sample chain 502 reach respective pre-adders 107, 108, 109 later, to account for the added delays 401-404 in output cascade chain 533 and reverse sample chain 503, thus restoring proper filter function.

Figure 6:
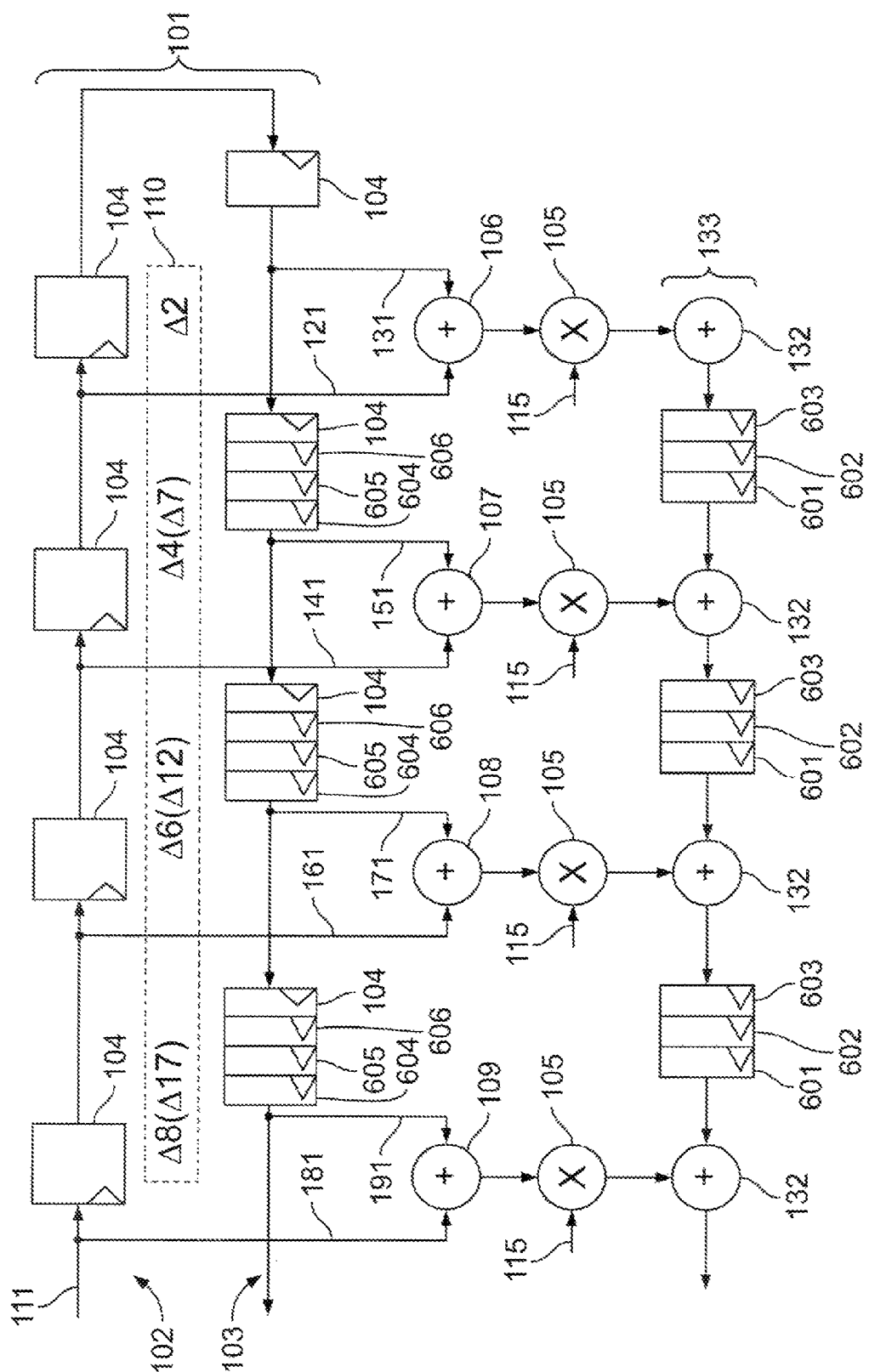
FIG. 6 shows the result of attempting to add three systolic delays between each pair of adjacent adders in the output cascade chain of the filter of FIG. 1.

FIG. 6 shows the result of attempting to add three systolic delays 601-603 between each pair of adjacent adders in output cascade chain 133. To maintain timing, corresponding delays 604-606 are added to input sample chain 101. However, the result is that instead of differences in delay of $\Delta 2, \Delta 4, \Delta 6, \Delta 8$ between the pairs of samples at the respective pre-adders, the differences in delay are $\Delta 2, \Delta 7, \Delta 12, \Delta 17$. Once again, while timing is maintained, the filter function is not.

Figure 7:
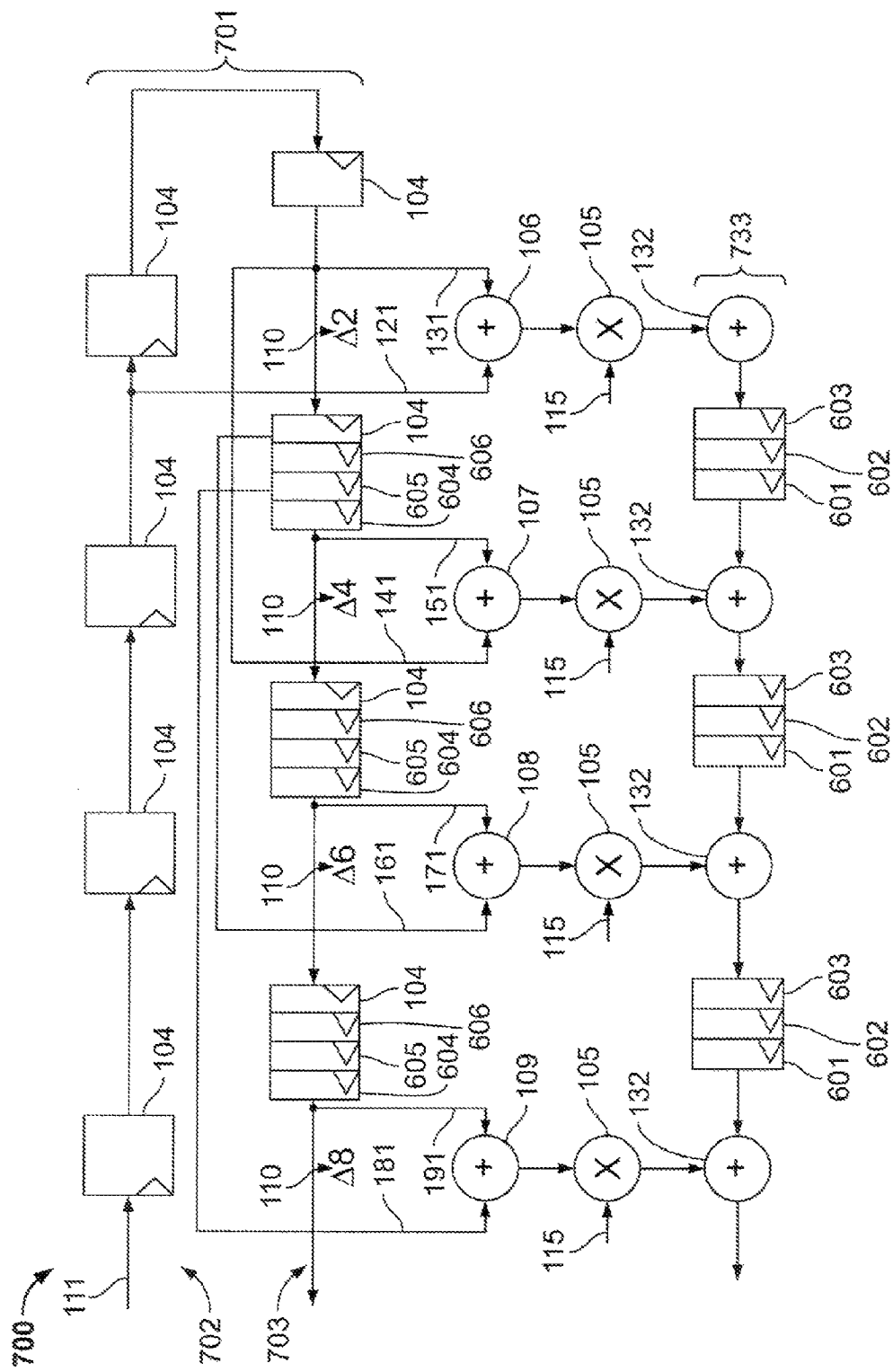
FIG. 7 shows one solution according to a third embodiment of the present invention for the problem illustrated in FIG. 6.

FIG. 7 shows a solution according to another embodiment of the present invention for the problem illustrated in FIG. 6. In filter 700, the input sample chain 701 is rewired so that the samples in forward sample chain 702 reach respective pre-adders 107, 108, 109 later, to account for the added delays 601-606 in output cascade chain 733 and reverse sample chain 703, thus restoring proper filter function.

Each of the solutions in the embodiments of FIGS. 3, 5 and 7 could be implemented easily in a fixed device such as an ASIC. However, even in fixed devices, it can be seen that the solution becomes increasingly complex as the number of systolic delays increases, with ever greater numbers of conductors used.

Moreover, some of the heaviest uses of FIR filters are in programmable devices such as FPGAs. For example, in radiofrequency applications such as Remote Radio Head applications, FIR filters may constitute the single largest resource use on a device. On such a device, in some implementations, even where digital signal processing (DSP) blocks are provided for implementation of FIR filters, up to 70% of the registers in the device may be used to support FIR functions. On a programmable device, it would be difficult to provide enough optional conductors to allow for any arbitrary systolic filter implementation using custom wiring patterns as in the foregoing embodiments.

Figure 8:
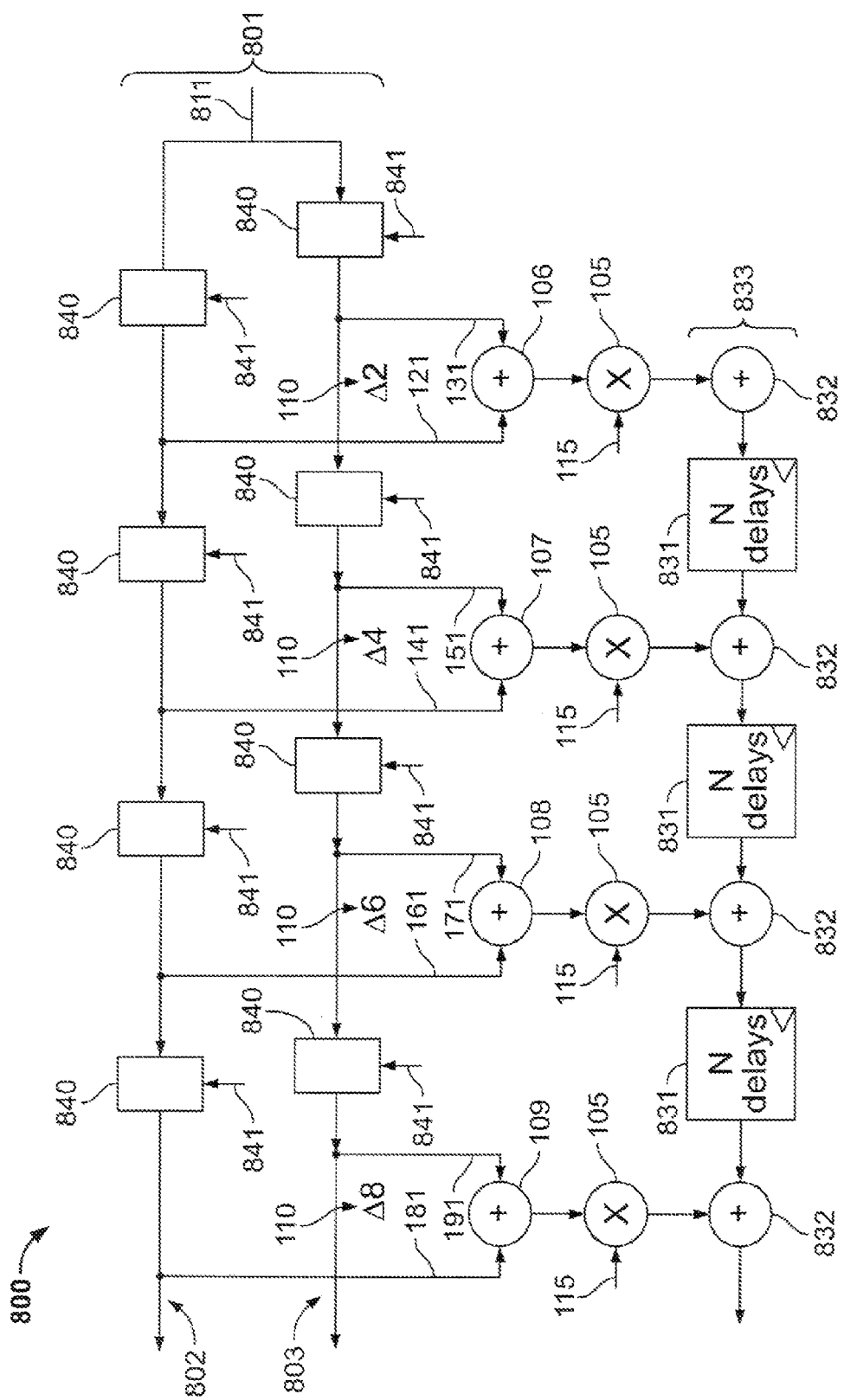
FIG. 8 shows a fourth embodiment of the present invention in which both legs of the input sample chain flow in the same direction.

Therefore, in accordance with a further embodiment 800, as illustrated in FIG. 8, samples are injected into input sample chain 801 at a common point 811—e.g., in the "center"—between the two legs 802, 803 of sample chain 801. Thus, in this embodiment 800, both legs of the sample chain flow in the same direction, which is right-to-left in this drawing, corresponding to the "reverse" sample chains of the earlier embodiments. However, the designations "forward" and "reverse" have little significance in this embodiment.

Figure 11:
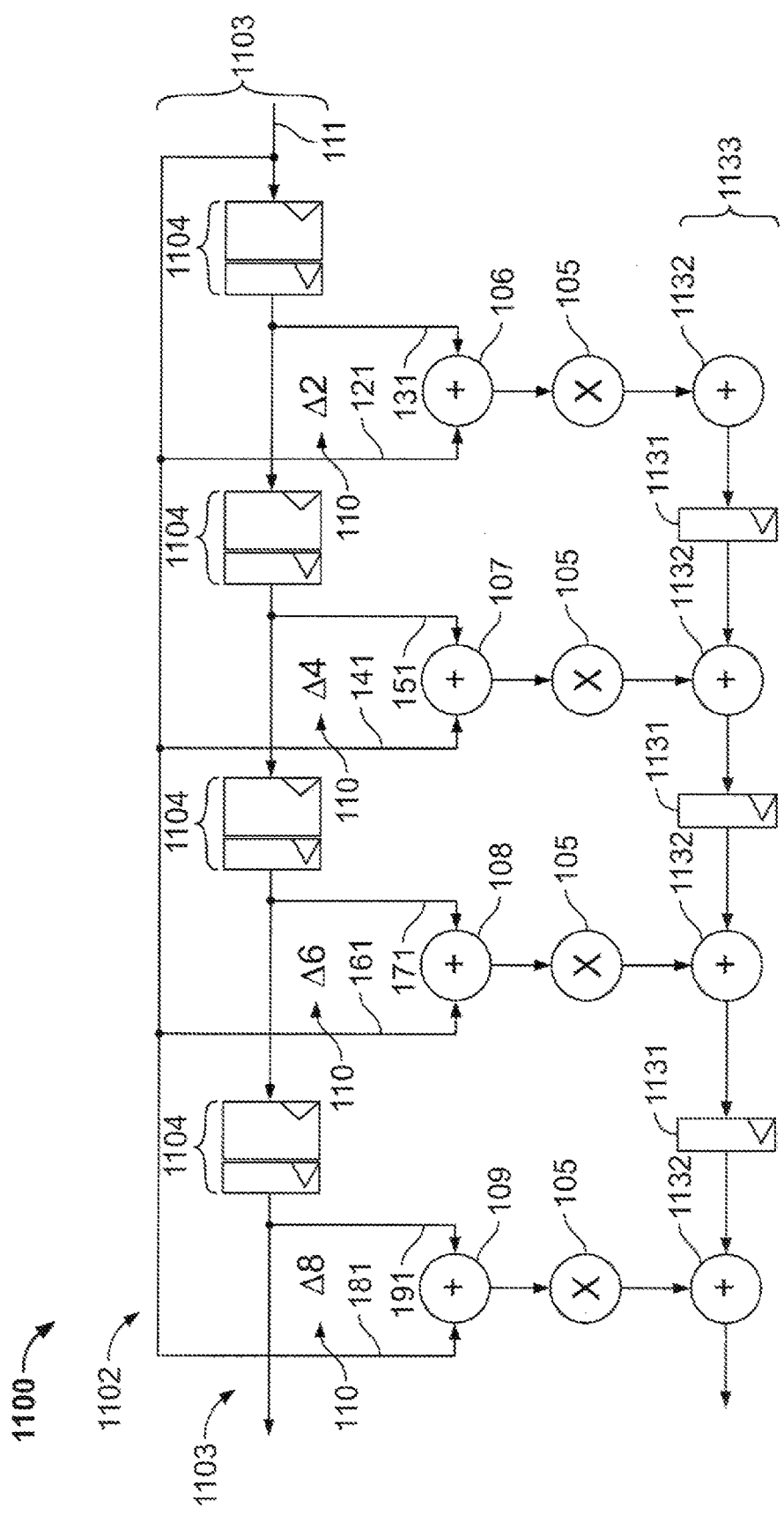
FIG. 11 shows a third particular implementation of the embodiment of FIG. 8.

Because both legs of the sample chain flow in the same direction, the samples in one leg would require negative delay to maintain the proper relationship between the two legs of the sample chains. Negative delays, while theoretically calculable, are physically unattainable. However, as pipelining is introduced, the positive delays introduced by for pipelining cancel the negative delays. Therefore, as long as the depth of pipelining is sufficient, this structure can function. In fact, the minimum necessary systolic delay is 1, which results in one leg of the sample chain becoming a conductor, with no delays, as shown in FIG. 11, below. The minimum systolic delay that allows both parts of the sample chain to travel in the same direction, with delays, as in FIG. 8, is 2.

To maintain the ability to configure filter 800 arbitrarily, memories 840 are used to implement both the systolic delays and the pipeline registers. By maintaining proper spacing between the write address and the read address, as input at 841, whatever non-negative delay is desired can be implemented. Memories 840 could be random access memory such as is provided in many programmable integrated circuit devices, such as in the FPGAs available from Altera Corporation, of San Jose, Calif. Alternatively, memories 840 could be shift registers.

In a generalized case, for a single channel, if the total number of delays 831 between adjacent adders 832 in the adder chain 833 (including both systolic delays and pipeline delays) is N, then the number of delays between taps in one leg of the sample chain is N+a−1, and the number of delays between taps in the other leg of the sample chain is N+a+1, where a is any non-negative integer. In the most basic case, a=0, so that if the total number of delays 831 between adjacent adders 832 in the adder chain is N, then the number of delays between taps in one leg of the sample chain is N−1, and the number of delays between taps in the other leg of the sample chain is N+1.

In any case, as noted above, the proper delay is achieved by properly adjusting the read addresses and the write addresses of the FIFO memories 840. For example, if N=1, then we would want 0 delays in the upper leg 802 of sample chain 801, and 2 delays in the lower leg 803 of sample chain 801. In one example of an addressing scheme to achieve that result, the write address sequence would be 0, 1, 2, 3, 4, . . . , the read address sequence (assuming a zero-latency memory) for upper leg 802 of sample chain 801 would be 0, 1, 2, 3, 4, . . . , and the read address sequence for lower leg 803 of sample chain 801 would be x, x, 0, 1, 2, . . . . However, this is only one example.

This further generalizes in a multichannel case, where the filter is time-shared across multiple channels and the input is an interleaved stream of samples from the different channels (number of channels=$N_{ch}$) to, if the total number of delays 831 between adjacent adders 832 in the adder chain 833 is N, then the number of delays between taps in one leg of the sample chain is $N-N_{ch}$, and the number of delays between taps in the other leg of the sample chain is $N+N_{ch}$, with the depths of the memories adjusted to match the number of channels $N_{ch}$. For both legs of the sample chain to run in the same direction, N must be greater than $N_{ch}$. For $N=N_{ch}$, the top chain would become a conductor as described below in connection with FIG. 11 for a single-channel case, and for $N<N_{ch}$, the two legs of the sample chain would run in opposite directions as in the single-channel embodiments of FIGS. 1-7.

Figure 9:
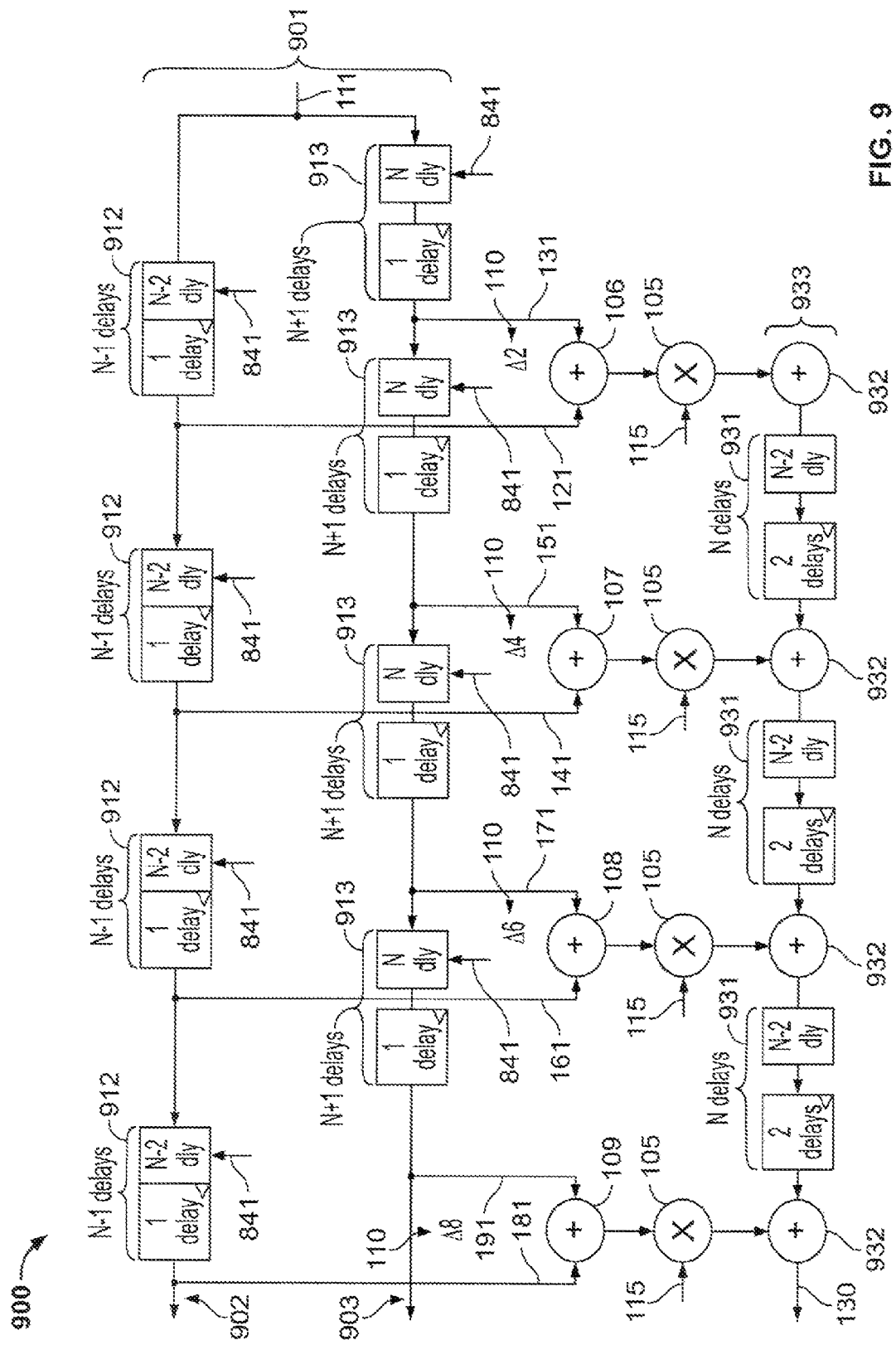
FIG. 9 shows a first particular implementation of the embodiment of FIG. 8.

FIG. 9 shows a single-channel case 900 where the delay 931 between adders 932 in the output cascade adder chain 933 is N, apportioned between 2 pipeline delays and N−2 systolic delays. In this case 900, the delay between taps in the upper leg 902 of sample chain 9001 is N−1, apportioned between 1 pipeline delay and N−2 systolic delays, and the delay between taps in the lower leg 903 of sample chain 901 is N+1, apportioned between 1 pipeline delay and N systolic delays. Although the pipeline delays and the systolic delays are drawn separately in FIG. 9, that distinction is conceptual, and at least in input sample chain 901 (if not in adder chain 932), both the pipeline delays and the systolic delays are implemented using memories 840 with proper addressing 841 as described above.

Figure 10:
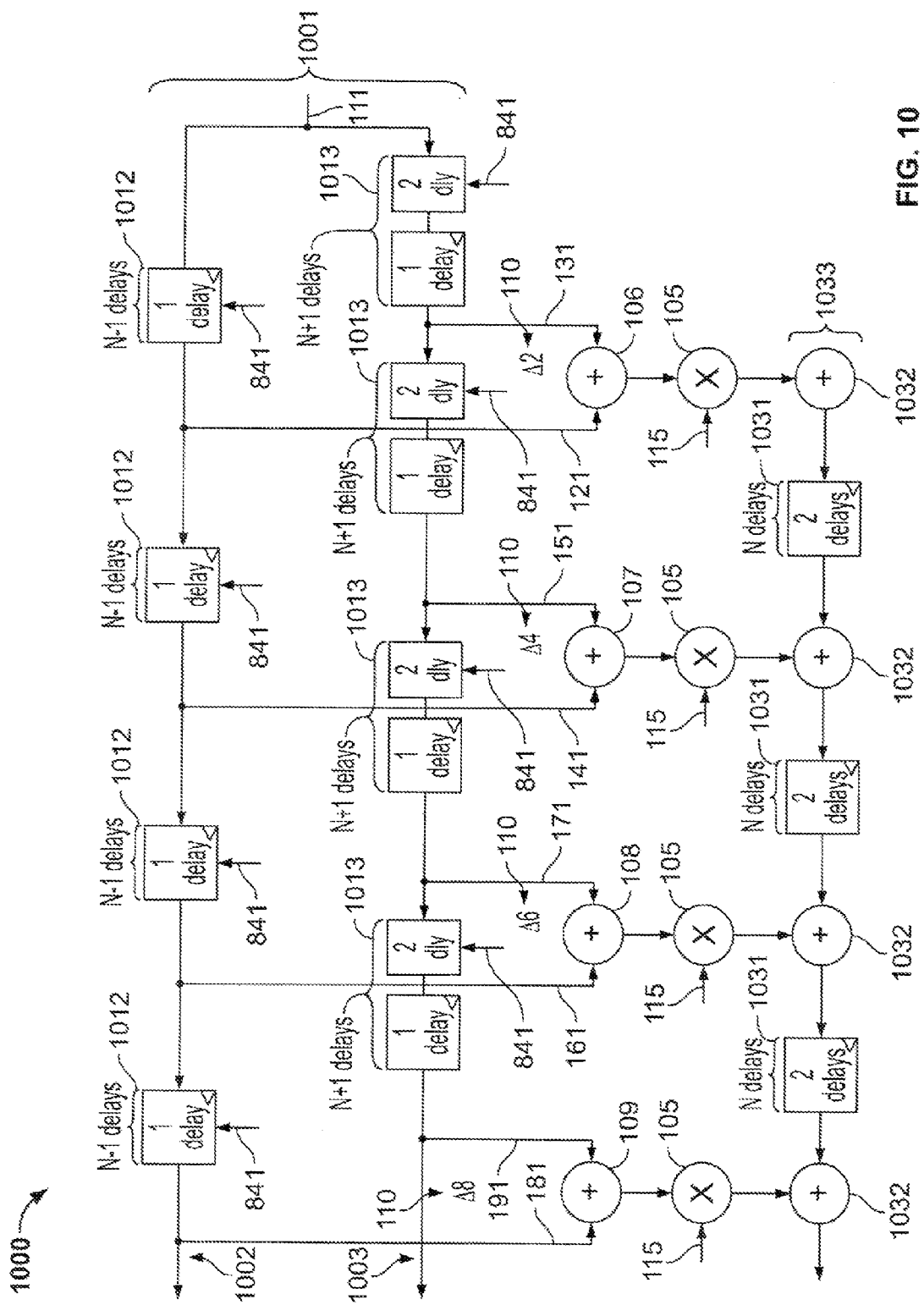
FIG. 10 shows a second particular implementation of the embodiment of FIG. 8.

Similarly, FIG. 10 shows a single-channel case 1000 where the delay 1031 between adders 1032 in the output cascade adder chain 1033 is N, including only 2 pipeline delays and no systolic delays (N=2). In this case 1000, the delay 1012 between taps in the upper leg 1002 of sample chain 1003 is N−1=1, including only 1 pipeline delay, and the delay 1013 between taps in the lower leg 1003 of sample chain 1001 is N+1=3, apportioned between 1 pipeline delay and 2 systolic delays. Although the pipeline delays and the systolic delays are drawn separately in FIG. 10, that distinction is conceptual, and at least in input sample chain 1001 (if not in adder chain 1032), both the pipeline delays and the systolic delays are implemented using memories 840 with proper addressing 841 as described above.

FIG. 11 shows a special single-channel case 1100 where the delay 1131 between adders 1132 in the output cascade adder chain 1133 is N=1. In this case 1100, the delay 1104 between taps in the lower leg 1103 of sample chain 1101 is N+1=2, and the delay between taps in the upper leg 1102 of sample chain 1103 is N−1=0, so the upper leg 1102 of sample chain 1103 collapses to a conductor. This is a particularly efficient case in a programmable device having dedicated DSP blocks that can be used to implement FIR filters, but where some of the filter, such as the memories for the delays, may be outside the DSP blocks. In this case, conductor 1102 can be outside the DSP blocks.

Figure 12:
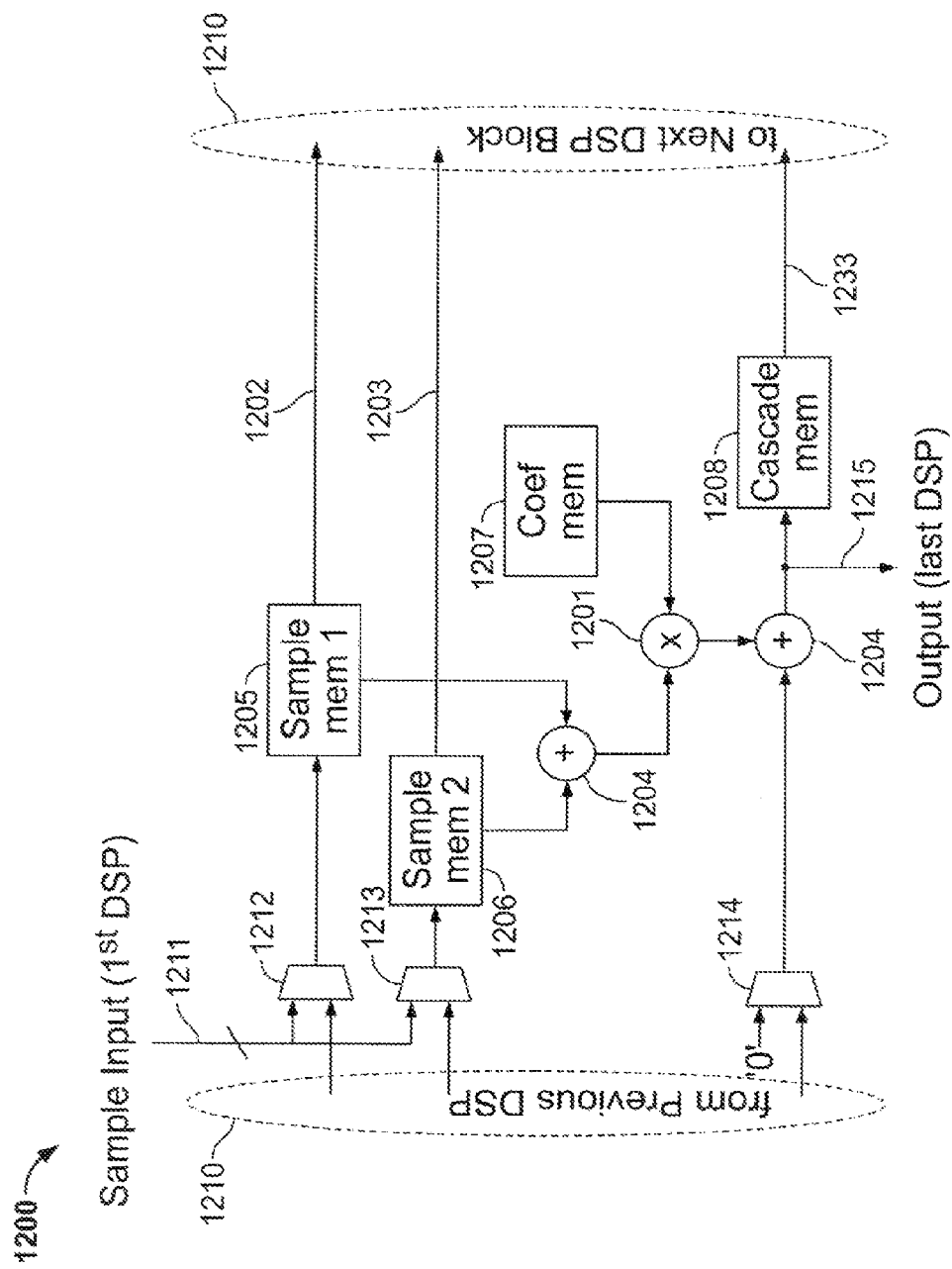
FIG. 12 shows an implementation of one tap of a filter according to the present invention.

FIG. 12 shows a repeating unit 1200 of a filter implemented in accordance with embodiments of this invention. One or more occurrences of all or part of filter unit 1200 can be implemented in a digital signal processing block, or other specialized processing block, of programmable device such as an FPGA, incorporating one or more multipliers 1201 along with adders 1204 and memories 1205-1208. Connections 1210 to the preceding and subsequent instances of DSP block 1200 could be direct connections, but also could be made using programmable interconnect resources of the programmable device. Similarly, one or both of sample memories 1205, 1206, as well as conductors 1202, 1203 for the legs of the input sample path, can be either inside DSP block 1200, or in the programmable resources of the programmable device.

It will be apparent that for the first of units 1200 in a filter, samples will be input at 1211 and selected by multiplexers 1212, 1213 instead of selecting the previous DSP block, while multiplexer 1214 will select a '0' input for the output cascade adder chain rather than selecting the output of the previous DSP block. Similarly, for the last of units 1200 in a filter, the output will be taken at 1215, rather than being cascaded at 1233. It will further be apparent that while the input sample chains are shown propagating from right to left in previous drawings, in this drawing the flow is from left to right.

It will be appreciated that because structures as described above include sample chains that need not loop back on themselves, the input and output need not be on the same side of the circuit. The structure can be pipelined by the optimal amount of registers. Moreover, in the case of N=1, as described above, one leg of the sample chain collapses to a conductor, allowing efficient mapping into DSP blocks of a programmable device. And for N>1, the structure allows the building of efficient chains of elements that can be configured into filters, which can be pipelined to arbitrary N to achieve any desired speed.

It should be noted that while the foregoing example implementations are for an even symmetric FIR filter, the present invention also may be used to implement an odd symmetric FIR filter, where the delays between the upper and lower sample chains for the first four taps are Δ1, Δ3, Δ5, Δ7 (and so one for higher taps).

Figure 13:
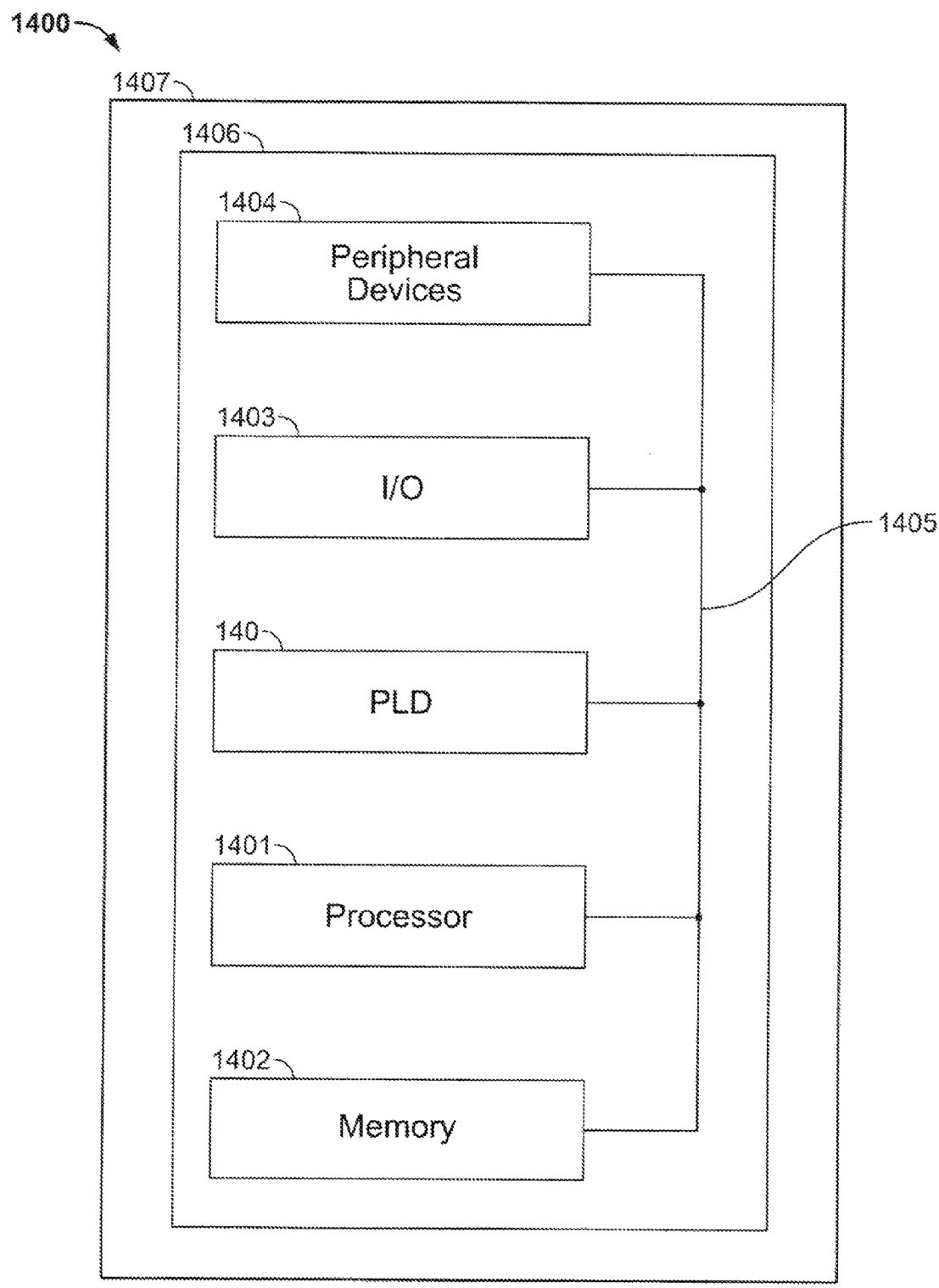
FIG. 13 is a simplified block diagram of an exemplary system employing a programmable logic device incorporating the present invention.

A PLD 140 configured to include a systolic FIR filter according to an implementation of the present invention may be used in many kinds of electronic devices. One possible use is in an exemplary data processing system 1400 shown in FIG. 13. Data processing system 1400 may include one or more of the following components: a processor 1401; memory 1102; I/O circuitry 1403; and peripheral devices 1404. These components are coupled together by a system bus 1405 and are populated on a circuit board 1406 which is contained in an end-user system 1407.

System 1400 can be used in a wide variety of applications, such as computer networking, data networking, instrumentation, video processing, digital signal processing, Remote Radio Head (RRH), or any other application where the advantage of using programmable or reprogrammable logic is desirable. PLD 140 can be used to perform a variety of different logic functions. For example, PLD 140 can be configured as a processor or controller that works in cooperation with processor 1401. PLD 140 may also be used as an arbiter for arbitrating access to a shared resources in system 1400. In yet another example, PLD 140 can be configured as an interface between processor 1401 and one of the other components in system 1400. It should be noted that system 1400 is only exemplary, and that the true scope and spirit of the invention should be indicated by the following claims.

Various technologies can be used to implement PLDs 140 as described above and incorporating this invention.

Figure 14:
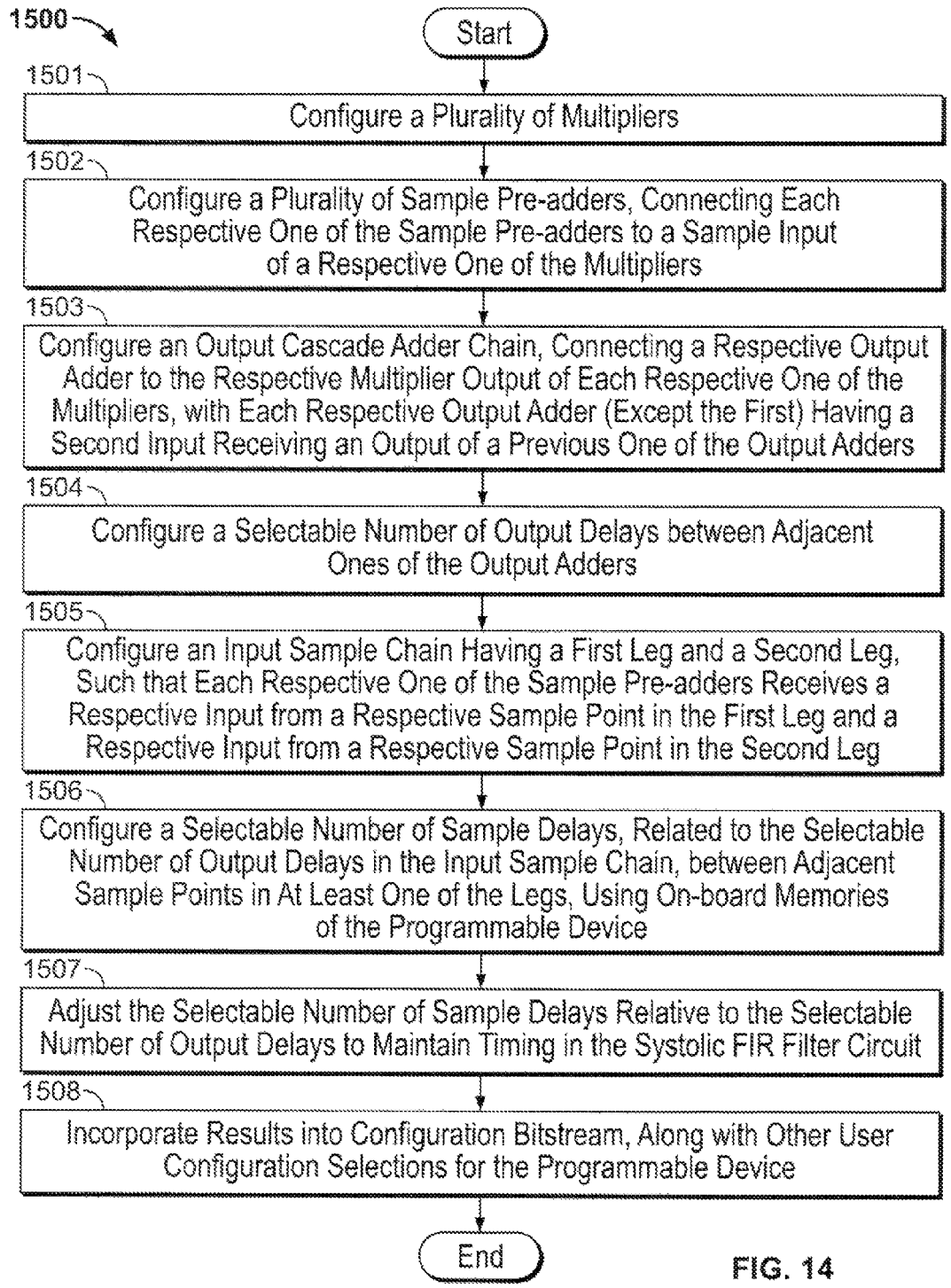
FIG. 14 is a flow diagram of a method according to an embodiment of the present invention.

One implementation of a method 1500 for configuring a programmable integrated circuit device as a systolic FIR filter circuit in accordance with an embodiment of the present invention is diagrammed in FIG. 14. Method 1500 begins at 1501 where a plurality of multipliers are configured. At 1502, a plurality of sample pre-adders are configured, connecting each respective one of the sample pre-adders to a sample input of a respective one of the multipliers. At 1503, an output cascade adder chain is configured, connecting a respective output adder to the respective multiplier output of each respective one of the multipliers, with each respective output adder (except the first) having a second input receiving an output of a previous one of the output adders. At 1504, a selectable number of output delays are configured between adjacent ones of the output adders. At 1505, an input sample chain is configured having a first leg and a second leg, such that each respective one of the sample pre-adders receives a respective input from a respective sample point in the first leg and a respective input from a respective sample point in the second leg. At 1506, a selectable number of sample delays, related to the selectable number of output delays in the input sample chain are configured between adjacent sample points in at least one of the legs, using on-board memories of the programmable integrated circuit device. At 1507, the selectable number of sample delays is adjusted relative to the selectable number of output delays to maintain timing in the systolic FIR filter circuit. At 1508, the results are incorporated into a configuration bitstream, along with other user configuration selections for the programmable device, and the method ends.

Thus it is seen that a systolic FIR filter in which the sample path can be adjusted along with the delays introduced by pipelining to maintain the correct sample relationships even in a pipelined systolic FIR filter has been provided.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. Systolic FIR filter circuitry, comprising:
   an input sample chain that comprises first, second, third, and fourth sample points, and a first number of delays between the second and fourth sample points;
   a first tap circuit that computes a first tap output based on a first sample from the first sample point and a second sample from the second sample point;
   a second tap circuit that computes a second tap output based on a third sample from the third sample point and a fourth sample from the fourth sample point; and
   an output cascade chain that computes at least a portion of a systolic FIR filter circuitry output based on the second tap output and the first tap output delayed by a second number of delays that is smaller than the first number of delays.

2. The systolic FIR filter circuitry of claim 1, wherein the second number of delays is one delay less than the first number of delays.

3. The systolic FIR filter circuitry of claim 1, wherein the input sample chain further comprises:
   a third number of delays between the first and third sample points, wherein the third number of delays is two delays less than the first number of delays.

4. The systolic FIR filter circuitry of claim 3, wherein the third number of delays is zero delays and the first number of delays is two delays.

5. The systolic FIR filter circuitry of claim 1, wherein the input sample chain further comprises:
   a first leg that includes the first sample point; and
   a second leg that includes the second and fourth sample points.

6. The systolic FIR filter circuitry of claim 5, wherein the input sample chain further comprises:
   an input at a point between the first and second legs.

7. The systolic FIR filter circuitry of claim 6, wherein the input sample chain further comprises:
   a memory circuit that stores a plurality of samples at respective addresses.

8. The systolic FIR filter circuitry of claim 7, wherein a first read access operation at the memory circuit retrieves the first sample from a predetermined address at a first point in time and wherein a second read access operation at the memory circuit retrieves the second sample from the predetermined address at a second point in time that occurs an even number of delays after the first point in time.

9. The systolic FIR filter circuitry of claim 1, wherein the first tap circuit further comprises:
   a pre-adder that computes a sum based on the first and second samples; and
   a multiplier that computes the first tap output by multiplying the sum with a FIR filter coefficient.

10. A method for configuring a systolic FIR filter circuit, comprising:
    using an input sample chain to provide first, second, third, and fourth samples at first, second, third, and fourth sample points, respectively;
    configuring a first tap circuit to compute a first tap output based on the first and second samples;
    configuring a second tap circuit to compute a second tap output based on the third and fourth samples; and
    selecting a first number of delays and a second number of delays, wherein the second number of delays is smaller than the first number of delays, wherein the first number of delays separates the second and fourth sample points, and wherein the second number of delays separates the first and second tap circuits in an output cascade chain.

11. The method of claim 10, further comprising:
selecting a third number of delays that is two delays less than the first number of delays, wherein the third number of delays separates the first and third sample points.

12. The method of claim 11, further comprising:
coupling first and third sample points in a first leg of the input sample chain; and
coupling second and fourth sample points in a second leg of the input sample chain.

13. The method of claim 12, further comprising:
connecting an input to the input sample chain to a point that connects the first and second legs.

14. The method of claim 11, wherein the input sample chain includes a memory circuit, further comprising:
storing a plurality of samples in the memory circuit at a respective plurality of write addresses.

15. The method of claim 14, further comprising:
implementing first and third number of delays by adjusting respective read addresses relative to the respective plurality of write addresses.

16. A systolic FIR filter circuit comprising:
an input sample chain having a first leg, a second leg, and an input at a point between the first and second legs;
a first sample point in the first leg that is separated from the input by a first number of sample delays;
a second sample point in the second leg that is separated from the input by a second number of sample delays, wherein the difference between the second number of sample delays and first number of sample delays is an even number of sample delays; and
a FIR filter tap circuit that combines a first sample from the first sample point with a second sample from the second sample point to produce a tap output.

17. The systolic FIR filter circuit of claim 16, wherein the FIR filter tap circuit further comprises:
a pre-adder that computes a sum of the first and second samples; and
a multiplier that computes a product of a FIR filter coefficient and the sum of the first and second samples.

18. The systolic FIR filter circuit of claim 16, further comprising:
an additional FIR filter tap circuit that combines a third sample from a third sample point in the first leg with a fourth sample from a fourth sample point in the second leg to produce an additional tap output, wherein the third sample point is separated from the first sample point by the first number of sample delays, and wherein the fourth sample point is separated from the second sample point by the second number of sample delays.

19. The systolic FIR filter circuit of claim 18, further comprising:
an output cascade chain comprising an adder having a first input that receives the additional tap output and a second input that receives the tap output delayed by a third number of sample delays.

20. The systolic FIR filter circuit of claim 19, wherein the first number of sample delays is two sample delays less than the second number of sample delays and one sample delay less than the third number of sample delays.

* * * * *